US010636699B2

(12) United States Patent
Huo

(10) Patent No.: US 10,636,699 B2
(45) Date of Patent: Apr. 28, 2020

(54) METHOD OF MANUFACTURING 3-D SEMICONDUCTOR DEVICE

(71) Applicant: Institute of Microelectronics, Chinese Academy of Sciences, Chaoyang, District, Beijing (CN)

(72) Inventor: Zongliang Huo, Zhongguancun (CN)

(73) Assignee: Institute of Microelectronics, Chinese Academy of Sciences (CN)

( * ) Notice: Subject to any disclaimer, the term of this patent is extended or adjusted under 35 U.S.C. 154(b) by 36 days.

(21) Appl. No.: 15/306,225

(22) PCT Filed: Jul. 10, 2014

(86) PCT No.: PCT/CN2014/081925
§ 371 (c)(1),
(2) Date: Feb. 9, 2017

(87) PCT Pub. No.: WO2015/165148
PCT Pub. Date: Nov. 5, 2015

(65) Prior Publication Data
US 2017/0170057 A1    Jun. 15, 2017

(30) Foreign Application Priority Data

Apr. 28, 2014 (CN) .......................... 2014 1 0174677

(51) Int. Cl.
*H01L 21/768* (2006.01)
*H01L 45/00* (2006.01)
(Continued)

(52) U.S. Cl.
CPC ...... *H01L 21/76816* (2013.01); *H01L 23/528* (2013.01); *H01L 23/5226* (2013.01);
(Continued)

(58) Field of Classification Search
CPC ......... H01L 27/11582; H01L 27/11578; H01L 27/1157; H01L 21/31105
See application file for complete search history.

(56) References Cited

U.S. PATENT DOCUMENTS

2009/0310425 A1* 12/2009 Sim .................. H01L 27/11526
365/185.29
2010/0219392 A1    9/2010 Awaya et al.
(Continued)

*Primary Examiner* — Jaehwan Oh
*Assistant Examiner* — Evan G Clinton
(74) *Attorney, Agent, or Firm* — Dickinson Wright PLLC

(57) ABSTRACT

A method of manufacturing three-dimensional semiconductor device, comprising the steps of: a) forming a device unit on a substrate, the said device includes a plurality of stack structures composed of the first material layer and the second material layer stacked along a direction perpendicular to the substrate surface; b) forming a contact lead-out region around the said device unit, the contact lead-out region comprises a plurality of sub-partitions, each of the sub-partitions respectively exposes a different second material layer; c) forming a photoresist on said substrate, covering said plurality of sub-partitions, exposing a portion of said second material layer; d) using the photoresist as a mask, simultaneously etching the portion of the second material layer exposed by said plurality of sub-partitions, until another second material layer beneath said second material layer is exposed; e) slimming the size of the photoresist to expose a portion of said another second material layer; f) repeating said steps d and step e, until all of the second material layers are exposed; g) forming contact leads, connecting each of the plurality of the second material layers. In accordance with the method of the present invention, the total number of etching process steps is reduced dramatically and the area utilization is improved effectively by selectively etching each of the sub-partitions.

17 Claims, 5 Drawing Sheets

(51) Int. Cl.
*H01L 27/11548* (2017.01)
*H01L 27/11519* (2017.01)
*H01L 27/11565* (2017.01)
*H01L 27/11575* (2017.01)
*H01L 23/522* (2006.01)
*H01L 23/528* (2006.01)
*H01L 27/115* (2017.01)
*H01L 27/11556* (2017.01)
*H01L 27/11582* (2017.01)
*H01L 27/24* (2006.01)

(52) U.S. Cl.
CPC ...... *H01L 27/115* (2013.01); *H01L 27/11519* (2013.01); *H01L 27/11548* (2013.01); *H01L 27/11565* (2013.01); *H01L 27/11575* (2013.01); *H01L 45/10* (2013.01); *H01L 45/1226* (2013.01); *H01L 45/145* (2013.01); *H01L 45/146* (2013.01); *H01L 45/1675* (2013.01); *H01L 27/11556* (2013.01); *H01L 27/11582* (2013.01); *H01L 27/2481* (2013.01)

(56) References Cited

U.S. PATENT DOCUMENTS

| | | | |
|---|---|---|---|
| 2011/0018036 A1 | 1/2011 | Hwang et al. | |
| 2012/0049267 A1* | 3/2012 | Jung | H01L 27/11578 257/324 |
| 2012/0171861 A1* | 7/2012 | Park | H01L 21/31144 438/639 |
| 2012/0306089 A1* | 12/2012 | Freeman | H01L 27/11548 257/773 |
| 2013/0341798 A1 | 12/2013 | Freeman et al. | |
| 2014/0054787 A1 | 2/2014 | Eun et al. | |

* cited by examiner

METHOD OF MANUFACTURING 3-D SEMICONDUCTOR DEVICE

This application is a National Phase application of, and claims priority to, PCT Application No. PCT/CN2014/081925, filed on Jul. 10, 2014, entitled "Method of Manufacturing 3-D Semiconductor Device", which claimed priority to Chinese Application No. 201410174677.7, filed on Apr. 28, 2014. Both the PCT Application and Chinese Application are incorporated herein by reference in their entireties.

TECHNICAL FIELD

The present invention relates to a method of manufacturing semiconductor device, particularly to a method of manufacturing three-dimensional semiconductor device.

BACKGROUND TECHNIQUE

In order to improve the density of the memory device, the industry has worked extensively at developing a method for reducing the size of a two-dimensional arrangement of memory cells. As the size of the memory cells of the two-dimensional (2D) memory devices continues to shrink, signal conflict and interference will significantly increase, so that it is difficult to perform operation of multi-level cell (MLC). In order to overcome the limitations of 2D memory device, the industry has developed a memory device having a three-dimensional (3D) structure, for example, using the BiCS (bit-cost Scalable) NAND configuration, the integration density is improved by arranging the memory cells on the substrate three-dimensionally, wherein the channel layer is vertically erected on the substrate, the gate is divided into three parts, namely a lower select gate layer, a middle control gate layer and an upper select gate layer, the crosstalk between signals can be reduced by distributing the gate signals into three groups of the gate electrodes.

The specific manufacturing processes of the above-described device generally include, depositing the lower select gate electrode layer on a silicon substrate, etching the lower select gate electrode layer to form trenches through to the substrate for further deposition of the lower portion of channel layer and the lead-out contact of the lower gate electrode, depositing the control gate layer on the lower select gate electrode layer, etching the control gate layer to form an intermediate channel region used for memory cell region and the lead-out contact for the middle control gate electrode, etching the control gate, dividing the whole device into a plurality of regions according to the word- and bit-line dividing requirements, depositing the upper select gate layer on the control gate layer and etching it, depositing to form the upper channel and the upper lead-out contact, then completing the device fabrication through the subsequent processes. In this process, the most critical etching step is merely the lithography of the intermediate memory channel region and the lead-out contact at the intermediate layer, which directly determines the integration density and signal anti-jamming capability of the whole device.

In the above-described BiCS process, in order to facilitate the etching of contact holes in each layer for signal output, stepped word line forming process is adopted to deposit the multilayer structure, i.e., firstly, forming the widest photoresist PR1 at the top of multilayer laminated structures for defining the bottom structure. After forming the widest stair at the bottom via RIE etching the laminated structure, using the processes of UV lighting, laser irradiation, heating or chemical treatment to slim the photoresist, forming the second widest photoresist PR2 that is used to define the secondary bottom, forming the second widest stair at the secondary bottom via RIE etching the laminated structure, and then narrowing the photoresist again to create PR3 . . . , repeating above processing steps until the desired stepped laminated structure is formed finally.

However, such circulating process of stepped photoresist-slimming followed by stair-etching is facing increasing challenges as the number of dielectric layers is increased, namely the multilayer laminated structures become thicken. One factor is that each additional gate layer or insulating layer between gates correspondingly results in one more processing step for both photoresist-narrowing and stair-etching, so the time consumption and manufacturing cost grow up significantly due to the multiplication of processing steps. And if the number of layers is too large, photoresist will be damaged severely, even some fracture or distortion can occur at the edge of the stairs, not only resulting in increased time consumption due to new photoresist re-coating, but also leading to short circuit or open circuit due to pattern distortion at the intermediate layer. In addition, for each layer, the gate electrode is shared, therefore apart from one necessary lead-out contact hole, the rest area is wasted, which decreases the memory integration density.

SUMMARY OF THE INVENTION

From the above, an object of the invention lies to overcome the above-mentioned technical difficulties, and propose an innovative 3-D semiconductor device and manufacturing method thereof.

According to one aspect of the present invention, it is provided that a method of manufacturing three-dimensional semiconductor device, comprising the steps of: a) forming a device unit on the substrate, the said device comprises a plurality of stack structures composed of the first material layer and the second material layer stacked along a direction perpendicular to the substrate surface; b) forming a contact lead-out region around the said device unit, the contact lead-out region comprises a plurality of sub-partitions, each of the sub-partitions respectively exposes a different second material layer; c) forming a photoresist on said substrate, covering said plurality of sub-partitions, exposing a portion of said second material layer; d) using the photoresist as a mask, simultaneously etching the portion of the second material layer exposed in said plurality of sub-partitions, until another second material layer beneath said second material layer is exposed; e) slimming the size of the photoresist to expose a portion of said another second material layer; f) repeating said steps d and step e, until all of the second material layers are exposed; g) forming contact leads, connecting each of the plurality of the second material layers.

Wherein etching said plurality of the first and the second material layers to form vertical trenches, forming a channel layer in each said trench.

Wherein, the material of said channel layer comprises monocrystal silicon, amorphous silicon, polycrystalline silicon, microcrystalline silicon, monocrystal germanium, SiGe, Si:C, SiGe:C, SiGe:H, and combinations thereof.

Wherein, the cross-sectional shape of the channel layer parallel to the substrate surface comprises geometric shapes selected from rectangular, square, diamond, circular, semi-circular, elliptical, triangular, pentagonal, hexagonal, octagonal and the combinations thereof, and includes those selected from solid geometry, hollow annular geometry, or a combination of a hollow annular peripheral layer and a central insulating layer as a result of revolution of geometric shapes.

Wherein, prior to and/or after forming the channel layer, forming a stack structure of the gate dielectric layers on sidewalls of said trenches.

Wherein said gate dielectric layer further comprises a tunneling layer, a storage layer, and a barrier layer.

Wherein, the tunneling layer comprises a monolayer or multilayer structure made of SiO2, high-k materials and combinations thereof; wherein, the high-k materials include, but are not limited to nitrides selected from SiN, AlN, TiN and combinations thereof, metal oxides selected from MgO, Al2O3, Ta2O5, TiO2, ZnO, ZrO2, HfO2, CeO2, Y2O3, La2O3, and combinations thereof, nitrogen oxides, and perovskite phase oxide selected from PZT, BST and combinations thereof.

Wherein, said storage layer comprises a monolayer or multilayer structure having a dielectric material with charge trapping capability, the dielectric material is selected from SiN, HfO, ZrO, and combinations thereof.

Wherein, said barrier layer comprises a monolayer or multilayer structure made of dielectric material selected from silicon oxide, aluminum oxide, hafnium oxide and combinations thereof.

One of said plurality of the first material layer or the second material layer is used as a gate conductive layer, the gate conductive layer comprises a monolayer or multilayer structure made of doped semiconductor material and/or conductive material, said doped semiconductor material comprises polycrystalline silicon, polycrystalline silicon germanium, amorphous silicon, amorphous silicon germanium, microcrystalline silicon, polycrystalline germanium, amorphous germanium and combinations thereof, said conductive material comprises a metal, an alloy of the metal or a nitride of the metal, wherein said metal comprises metal selected from Co, Ni, Cu, Al, Pd, Pt, Ru, Re, Mo, Ta, Ti, Hf, Zr, W, Ir, Eu, Nd, Er, La and combinations thereof.

Wherein, a barrier layer of nitride between the gate dielectric layer and the gate conductive layer is further included, the nitride is MxNy, MxSiyNz, MxAlyNz, MaAlxSiyNz, wherein the M is Ta, Ti, Hf, Zr, Mo, W, and combinations thereof, and the x, y are both greater than or equal to 0 and less than or equal to 1.

Wherein, the device unit comprises a three-dimensional memory based on charge trapping, three-dimensional stack structure of memory cells with polycrystalline or metal floating gate, and a three-dimensional variable resistance memory.

Wherein, said sub-partitions are located on the same side or the different sides of the device unit.

Wherein the number of said sub-partitions N is a positive integer greater than or equal to 2.

Wherein said contact leads are distributed in the same plane, or in different planes belonging to different sub-partitions.

Wherein said step b further comprises, forming a photoresist on the substrate, followed by sequentially exposing each one of said sub-partitions with a total number of N, using the photoresist as a mask, etching said stack structures, sequentially exposing the i*M/N-th layer of the second material layers in i-th sub-partition, wherein M is the total number of the second material layers.

Wherein said a plurality of the first material layers are used as insulating spacer layer between gate electrodes.

In accordance with the manufacturing method of three-dimensional semiconductor device of the present invention, dividing the lead-out contact region into a plurality of sub-partitions and completing the multilayer film selective etching, performing the same process of photoresist-slimming and multilayer film etching in different sub-partitions, in order to selectively realize the selective etching for each sub-partition, thereby, the total number of etching process steps is reduced dramatically, and the area utilization of the lead-out contact region in three-dimensional devices is improved effectively.

BRIEF DESCRIPTION OF THE DRAWINGS

Referring to the following drawings, the technical solutions of the present invention are described in detail, in which:

FIG. 12 is a top view of a three-dimensional semiconductor device manufacturing method according to another embodiment of the present invention; and FIG. 13 is a top view of a three-dimensional semiconductor device manufacturing method according to the third embodiment of the present invention.

DETAILED DESCRIPTION

The features and technical effects of the present invention will be described in detail with reference to the drawings and schematic embodiments, disclosing a method for manufacturing a semiconductor device effectively improving the reliability of the device. It should be noted that the similar reference numbers denote the similar structure. The terms used in the present invention like "first", "second", "up/upon", "down/low/beneath/under" etc. can be used in denoting various device structures, and do not indicate the relationship in space, sequence or hierarchy of the device structures unless specially illuminated these terms, if not stated otherwise.

Figure 1:
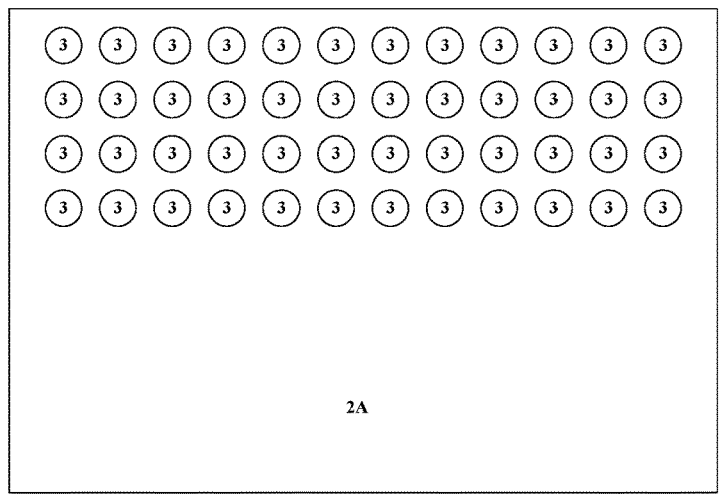
FIGS. 1 to 10 are top views of the various steps of the 3-D semiconductor device manufacturing method in accordance with the present invention.

As shown in FIG. 1, the device unit is formed on the substrate 1. According to the embodiments shown in figures of the invention, the device units are a plurality of vertical channels 3. In other embodiments of the invention not shown in the figure, the device unit can be memory cells with floating gates made of polycrystalline silicon or metal, also can be varistors stacked in a three-dimensional variable resistance memory.

First, a stack structure 2 composed of a plurality of first material layers 2A and a plurality of second material layers 2B is formed alternately on the substrate 1. For compatibility with the existing IC fabrication process, the substrate is preferably a substrate containing silicon material, e.g., Si, SOI, SiGe, Si: C and the like. In one embodiment of the invention, the first layers 2A of the stack structure are insulating dielectric selected from the following materials: such as silicon oxide, silicon nitride, amorphous carbon, amorphous diamond-like carbon (DLC), germanium oxide, aluminum oxide, aluminum nitride, and combinations thereof; the second layers 2B are semiconductor or conductor material selected from the following materials: polycrystalline silicon, amorphous silicon, microcrystalline silicon, SiGe, Si: C, metal. In an embodiment of the invention, the layers 2A and 2B are silicon oxide and polycrystalline silicon laminated structures (OP stack). The first material layers have a first etch selectivity, and the second material layers have a second etch selectivity which is different from the first etch selectivity. In another embodiment of the present invention, the first layers and the second layers have a large selection ratio (e.g., greater than 5:1) under wet etching conditions or oxygen plasma dry etching condition. The method for depositing layers 2A, 2B comprises PECVD, LPCVD, HDPCVD, MOCVD, MBE, ALD, thermal oxidation, evaporation, sputtering, and other processes. In one embodiment of the invention, the number of both of the first layers 2A and the second layers 2B is 14, that means 14 A and B laminated substructures have been formed. In an embodiment of the invention, the layers 2B are used for contact lead of word line WL, thus, from the substrate to the top, a plurality of layers 2B can be labeled as WL1, WL2 . . . until WL14. In the best embodiment of this invention based on gate-first process, one of the first or the second material layers comprises a doped semiconductor material (e.g., polycrystalline silicon, amorphous silicon, microcrystalline silicon, polycrystalline germanium, amorphous germanium, polycrystalline SiGe, etc.) and/or electrically conductive material such as metals, metal alloys, metal nitrides, so it is used as a control gate electrode (the sidewall of the control gate 2B may further comprises a nitride barrier layer, the material can be selected from $M_xN_y$, $M_xSi_yN_z$, $M_xAl_yN_z$, $MaAl_xSi_yN_z$, wherein M is Ta, Ti, Hf, Zr, Mo, W, or other elements). While another of the first or the second material layers comprises an insulating dielectric material (e.g., above-mentioned semiconductor materials or metal-based oxide or nitride and combinations thereof) and is used as the insulating spacer layer between the control gate electrodes.

Then, the stack structure 2 is etched through till the substrate 1 is exposed, forming a plurality of trenches vertically punching through the stack structure and used to define the channel regions. Preferably, the stack structure 2 of the first layers 2A/the second layers 2B is anisotropically etched by RIE or plasma dry etching, exposing the substrate 1 and the sidewalls of layers 2A/2B which are alternately laminated on the substrate 1. More preferably, the process conditions of anisotropic etching of stack structure are controlled in order to make the lateral etching rate being significantly less than the longitudinal etching rate, obtaining a vertical deep hole or deep trenches with high aspect ratio (e.g., aspect ratio AR being greater than or equal to 10:1). The cross-sectional shape by cutting parallel to the surface of substrate 1 may be various geometric shapes selected from rectangular, square, diamond, circular, semicircular, elliptical, triangular, pentagonal, hexagonal, octagonal, and etc., which is circular in the embodiment shown in FIG. 1.

In an embodiment of the present invention based on the gate-first process, the second material layers 2B are used as conductive material of control gate, thus, after forming deep trenches, the stack structure of gate dielectric material is firstly deposited on the bottom and the sidewalls of the trenches (attached to the inner-walls of the channel layer, not shown in FIG. 1). Deposition methods include PECVD, HDPCVD, MOCVD, MBE, ALD, evaporation, sputtering or the like. Gate dielectric layer preferably further comprises a plurality of sub-layers, e.g., a tunneling layer, a storage layer, a barrier layer. Wherein the tunneling layer comprises $SiO_2$ or high-k material, wherein the high-k materials include but are not limited to nitride (such as SiN, AlN, TiN), metal oxides (mainly subgroup and lanthanide metal element oxides, such as MgO, $Al_2O_3$, $Ta_2O_5$, $TiO_2$, ZnO, $ZrO_2$, $HfO_2$, $CeO_2$, $Y_2O_3$, $La_2O_3$), nitrogen oxides (e.g., HfSiON), perovskite phase oxides (e.g. $PbZr_xTi_{1-x}O_3$ (PZT), $Ba_xSr_{1-x}TiO_3$(BST)), etc., the tunneling layer may have single layer structure or multilayer stack structure of above materials. The storage layer comprises dielectric material having charge trapping capabilities, e.g., SiN, HfO, ZrO, etc., and combinations thereof, also may have single layer structure or multilayer stack structure of above materials.

Then at the bottom of trenches, channel layer 3 is formed on the surface of substrate 1. The material of the channel layer 3 includes monocrystalline silicon, amorphous silicon, polycrystalline silicon, microcrystalline silicon, single crystal germanium, SiGe, Si: C, SiGe: C, SiGe: H and other semiconductor materials. The deposition processes include PECVD, LPCVD, HDPCVD, MOCVD, MBE, ALD, thermal oxidation, evaporation, sputtering and other processes. In one embodiment of the invention, the deposition process of the channel layer 3 is completely filling the sidewalls of the trenches to form a solid cylinder. In other embodiments of the present invention not shown in figures, the deposition process of channel layers 3 is chosen to completely or partially filling the trenches, thereby forming a plurality of solid columns, hollow rings (with air gaps inside), or coreshell structures having hollow rings with filled insulating layer (not shown). The shape of the horizontal cross section of channel layers 3 is similar and preferably conformal to those of trenches, and can be various solid geometric shapes, such as rectangle, square, diamond, circular, semi-circular, elliptical, triangular, pentagonal, pentagonal, hexagonal shaped, octagonal etc., or annular or tubular hollow structures evolved from geometric shapes described above (and its interior may be filled with insulating layers).

It is worth to note that, in the preferred embodiment of the invention shown in FIG. 1, it merely shows a device structure prepared by the Gate-first process. The three-dimensional memory can also be formed by Gate-last process.

Figure 2:
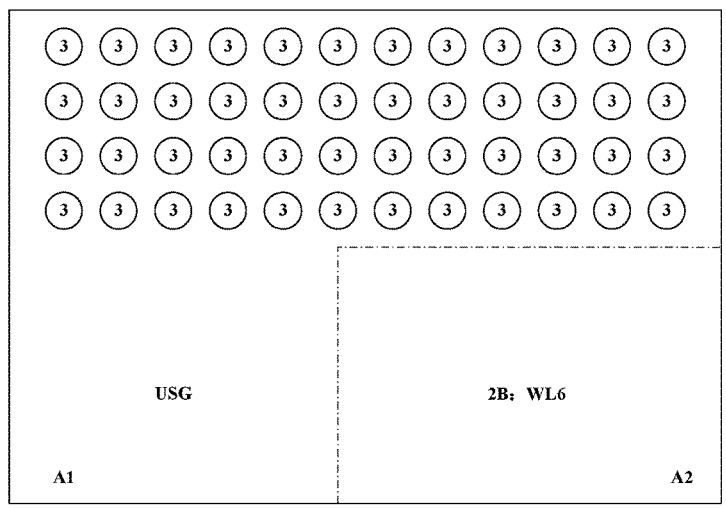
Figures 12, 13:
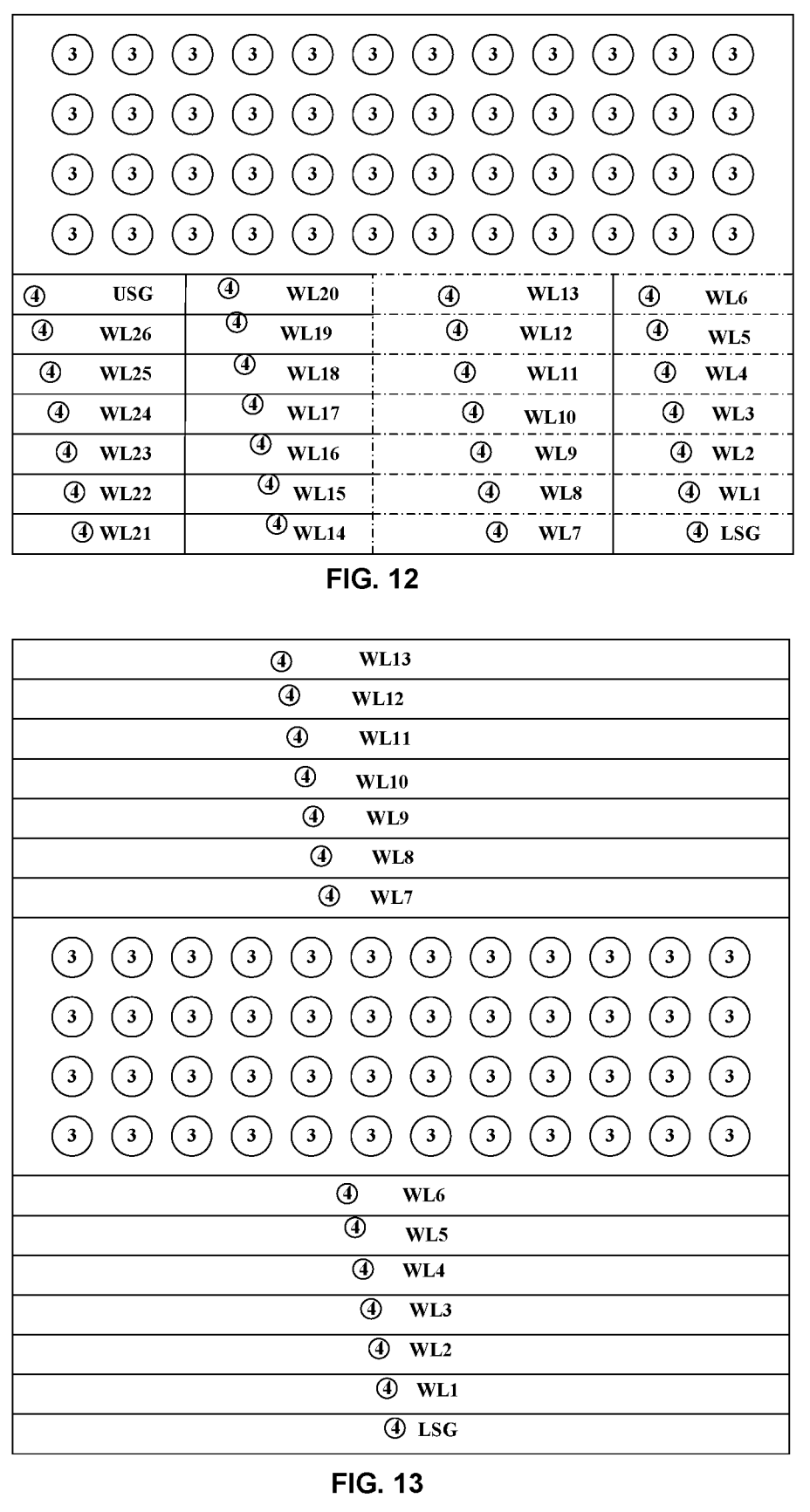

As shown in FIG. 2, the contact lead-out region A used for exporting and importing electrical signals of the device unit is divided into a plurality of sub-partitions, FIG. 2 shows two sub-partitions A1 and A2. In one embodiment of the invention, the contact lead-out sub-partition A1, A2 are located on one side of the channel layer 3 (e.g., the bottom in FIG. 2). However, in another embodiment of the invention, for example, shown in FIG. 13, there are four sub-partitions located on the same side of the channel layer 3, namely A1, A2, A3, A4, each of them is used to define 7 OP laminated structures, i.e., the total number of layers 2B is 14. Naturally, the number of sub-partition N can be any positive integer larger than or equal to 2, and M is the total number of the contacts required led out from the device unit, then each sub-partition can be used to define the lead-out contacts of OP laminated structure with the number of M/N. As shown in FIG. 2, in an embodiment of the invention, the device unit and the sub-partition A1 are coated with photoresist (not shown), using the photoresist as a mask, etching the exposed sub-partition A2 until the second material layer WL6 of the 7th floor is exposed, the second material layers WL7 to USG remain at the 8th to the 14th floor in sub-partition A1. As to the situation that each of N sub-partitions is used for defining M/N laminated structures, using lithography/etching process for N−1 times, sequentially exposing the second material layer 2B of the floor M/N in the N-th sub-partition, the second material layer of the floor 2M/N in the (N−1)-th sub-partition, the second material layer of the floor 3M/N in the (N−2)-th sub-partition . . . until the second material layer of the floor (N−1)M/N in the second sub-partition, the photoresist remained in the first sub-partition protecting the second material layer of the floor M and beneath the floor M (the total number of the second material layers is M/N) from being affected by etching. An anisotropic dry etching process is preferred by said etching process to reduce the distortion at the edge of patterns, e.g., RIE.

Figure 3:
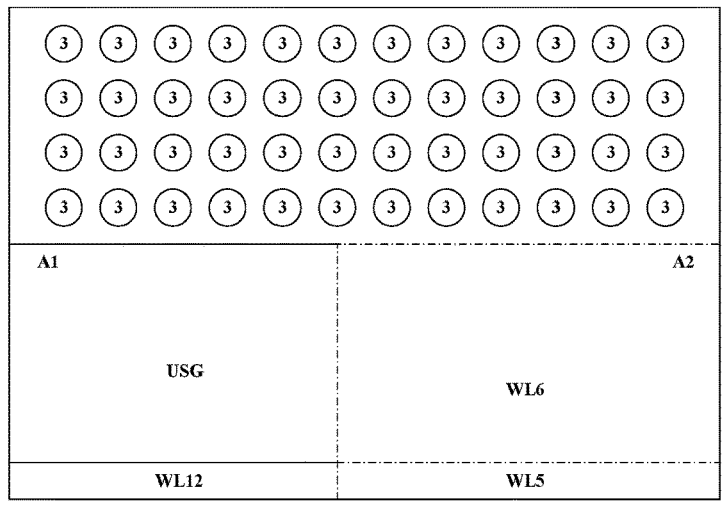

As shown in FIG. 3, all the sub-partitions are coated by photoresist PR1, exposing a part of the second material layer 2B in every sub-partition, and then etching to remove this part with the photoresist PR1 as a mask. In the embodiment shown in FIG. 3, PR1 exposes part of the USG at the top layer and part of WL7 at layer 7, and then exposes WL12 at layer 13 shown in FIG. 3 and WL5 at layer 6 after etching. For the cases of M and N, PR1 sequentially exposes the second material layer 2B of layer M, layer (N−1)M/N . . . until the layer M/N, and then exposes part of the layer material 2B of layer M−1, layer ((N−1)M/N)−1, . . . until layer(M/N)−1 after etching, these parts will be etched subsequently to form contact holes for exporting electrical signals. An anisotropic dry etching process is preferred by said etching process to reduce the distortion at the edge of patterns, e.g., RIE.

Figure 4:
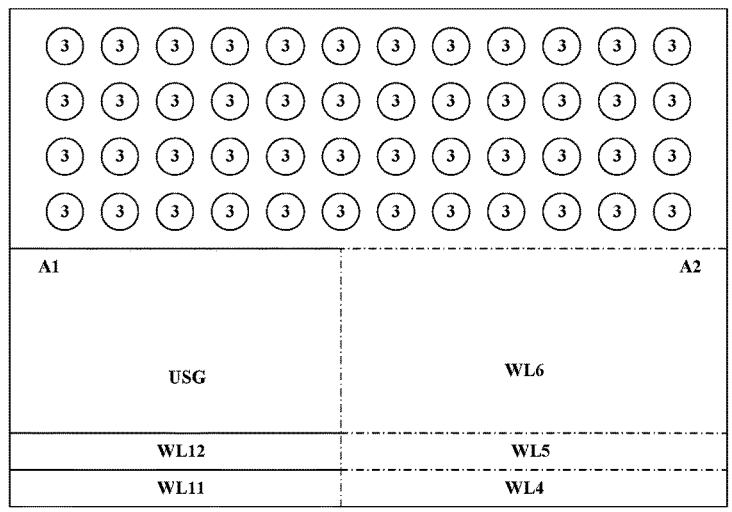
Figure 5:
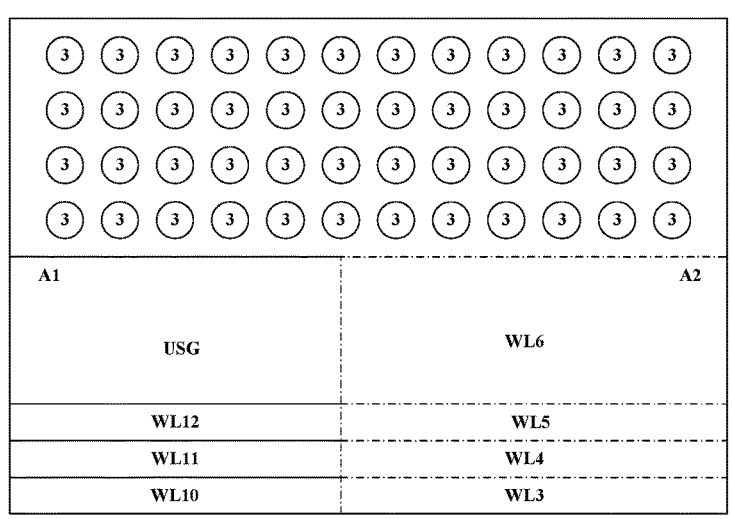
Figure 6:
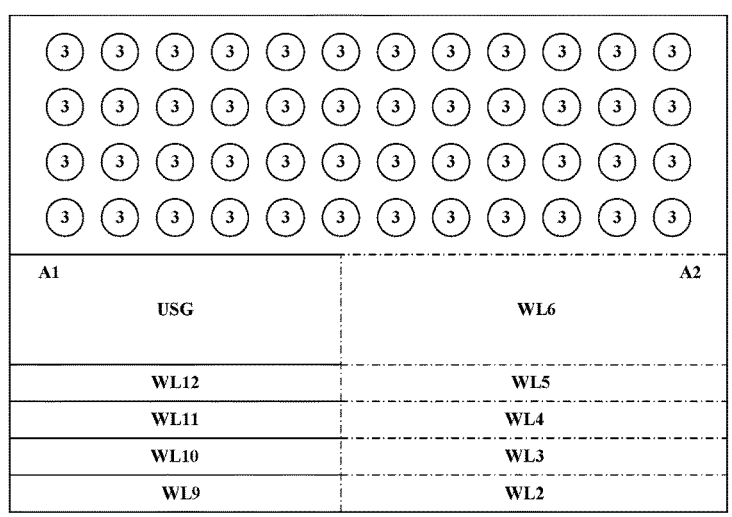
Figure 7:
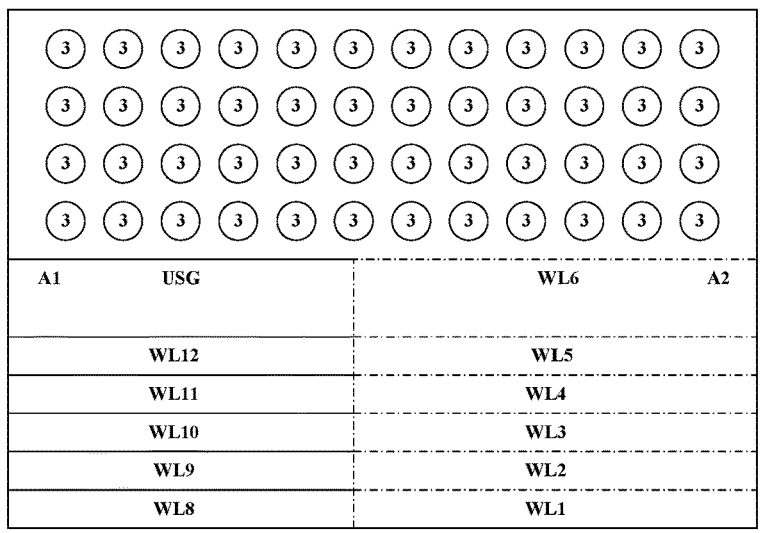
Figure 8:
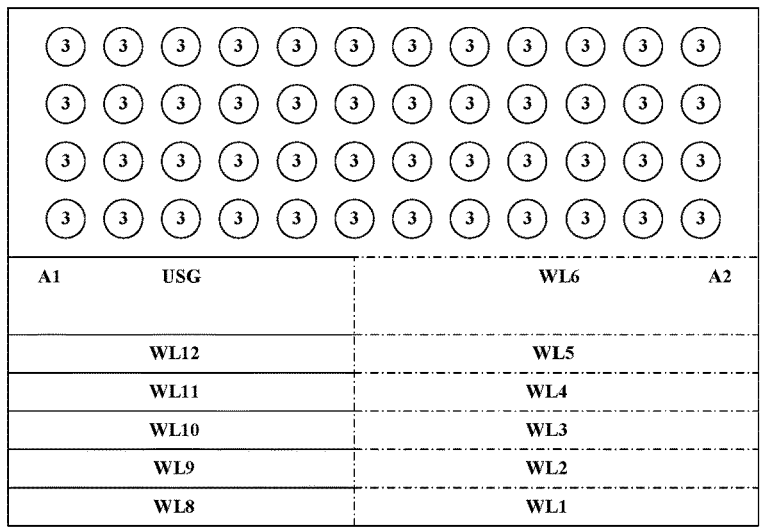

As shown in FIG. 4, implementing reduction process, decreasing the width/length of photoresist PR1 to form PR2, in order to expose the material 2B of the layer (M−1), layer ((N−1)M/N)−1, until the layer (M/N)−1 (corresponding to WL12 of layer 13 and WL6 of layer 6 in embodiment shown in FIG. 4), then using the etching process similar to that shown in FIG. 3 to etch the exposed material layer 2B, in order to expose the downward layer (M−2) . . . layer (M/N)−2 (corresponding to WL11 of layer 12 and WL4 of layer 5 in embodiment shown in FIG. 4). Wherein the reduction process involves using the processes such as UV lighting, laser irradiation, heating or chemical treatment to slim the width/length of photoresist, slimming it to form the photoresist for defining the lead-out contacts for the next layer.

Figure 9:
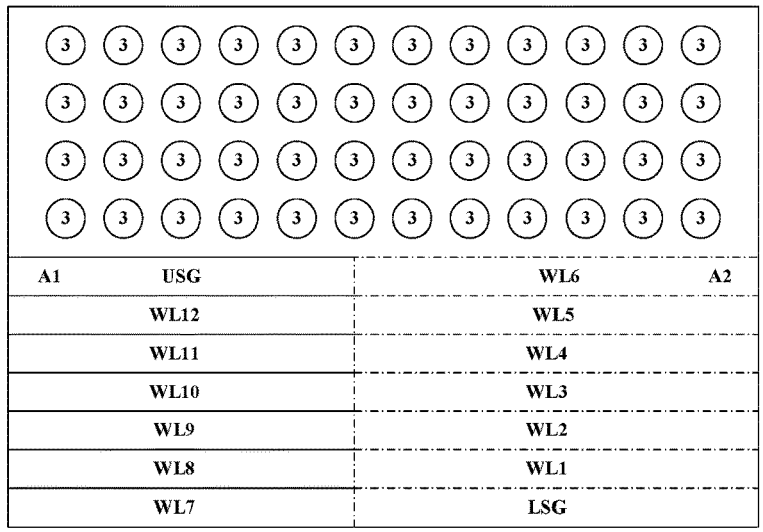

Thereafter, as shown in FIG. 5 to FIG. 9, repeating the steps shown in FIG. 3 and FIG. 4, i.e., firstly slimming the width/length of photoresist to expose the second material layer, and then using the photoresist as a mask to etch the second material layer until the lower second material layer is exposed. Wherein the second material layer 2B of the top layer in the first sub-partition A1 in FIG. 9 is marked as UGS and used for leading out the top layer select gate, the second material layer 2B of the bottom layer in the second sub-partition A2 is marked as LSG and used for leading out the bottom layer select gate.

Figure 10:
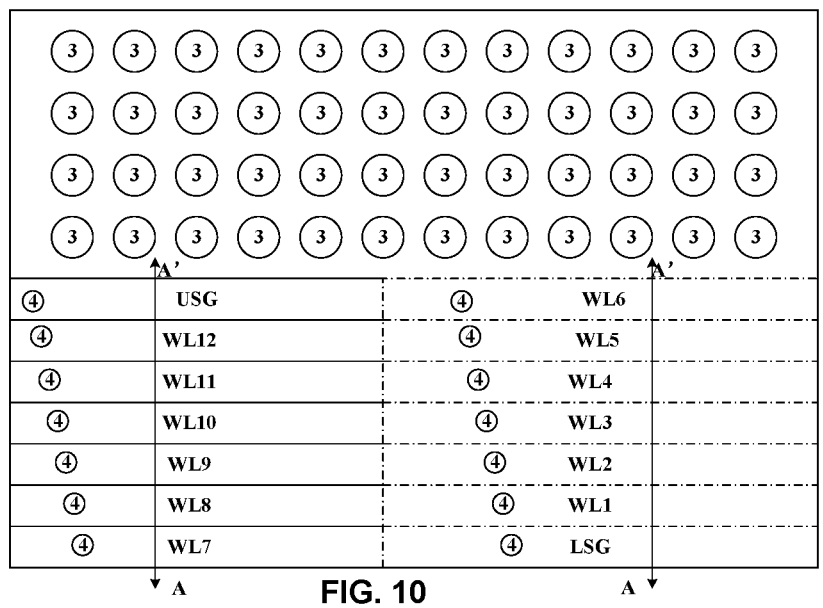

Finally, as shown in FIG. 10, the interlayer dielectric (ILD, not shown) layer is formed on the device, a plurality of contact holes are formed by etching the ILD, until a plurality of the second material layer 2B used as WL are exposed, and then filling the contact holes with conductive material such as metals, metal alloys, metal nitrides, etc., forming WL contact plug 4, thus completing peripheral WL connection settings.

Figure 11:
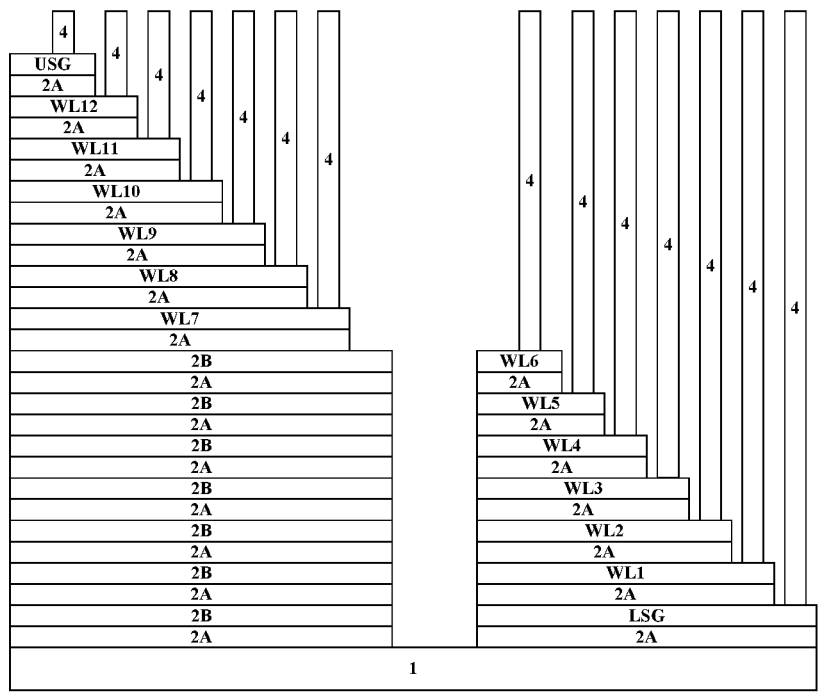
FIG. 11 is a cross-sectional view taken along A-A' line of a three-dimensional semiconductor device in accordance with the present invention.

It is worth to note that the lead wire of every contact plug 4 is vertically distributed as shown in FIG. 11, however, in the actual layout design process, these metal wires can be parallel distributed in the same plane, or may be distributed in different planes belonging to different sub-partitions A1.

In accordance with the manufacturing method of three-dimensional semiconductor device of the present invention, dividing the lead-out contact region into a plurality of sub-partitions and completing the multilayer film selective etching, performing same photoresist reduction process and multilayer film etching in different sub-partitions, in order to selectively realize the selective etching for each sub-partition, thereby, the total number of etching process steps is reduced dramatically, and the area utilization of the lead-out contact region in three-dimensional devices is improved effectively.

Although the present invention is descried with one or more exemplary embodiments, one skilled in the art will recognize that various appropriate changes and equivalents of the device structures can be made without departing from the scope of the present invention. Furthermore, a great deal of modifications of specific situation or materials can be made to the disclosed enlightenment without departing from the scope of the present invention. Thus, the intent of the present invention is not limited to the disclosed illustrative examples for implementing the best embodiments. The disclosed device structures and the method of manufacturing the same will include all the exemplary embodiments within the scope of the invention.

What is claimed is:

1. A method of manufacturing three-dimensional semiconductor device, comprising the ordered steps of:
   a) forming a device unit on a substrate, the said device unit comprises a plurality of stack structures composed of a first material layer and a second material layer stacked along a direction perpendicular to the substrate surface;
   b) forming a contact lead-out region around the said device unit, the contact lead-out region comprises a plurality of sub-partitions, wherein from a top view each of the sub-partitions respectively exposes a second material layer made of doped semiconductor material and/or conductive material with a different height in a vertical direction;
   c) forming a photoresist on said substrate, covering said plurality of sub-partitions, exposing a portion of said second material layer;
   d) using the photoresist as a mask, simultaneously etching the stack structures exposed in the plurality of sub-partitions, until another second material layer beneath said second material layer is exposed;
   e) slimming the size of the photoresist to expose a portion of said another second material layer;
   f) repeating said steps d and step e, until all of the second material layers are exposed;
   g) forming contact leads, electrically connecting each of the plurality of the second material layers.

2. The method of claim 1, wherein, etching said plurality of the first and the second material layers to form vertical trenches, forming a channel layer in said trenches.

3. The method of claim 2, wherein, the material of said channel layer comprises monocrystal silicon, amorphous silicon, polycrystalline silicon, microcrystalline silicon, monocrystal germanium, SiGe, Si:C, SiGe:C, SiGe:H, and combinations thereof.

4. The method of claim 2, wherein, the cross-sectional shape of the channel layer parallel to the substrate surface comprises geometric shapes selected from rectangular, square, diamond, circular, semi-circular, elliptical, triangular, pentagonal, hexagonal, octagonal and the combinations thereof, and includes those selected from solid geometry, hollow annular geometry, or a combination of a hollow annular peripheral layer and a central insulating layer as a result of revolution of geometric shapes.

5. The method of claim 2, wherein, prior to and/or after forming the channel layer, forming a stack structure of the gate dielectric layers on sidewalls of said trenches.

6. The method of claim 5, wherein, said gate dielectric layer further comprises a tunneling layer, a storage layer, and a barrier layer.

7. The method of claim 6, wherein, the tunneling layer comprises a monolayer or multilayer structure made of SiO2, high-k materials and combinations thereof; wherein, the high-k materials include, but are not limited to nitrides selected from SiN, AlN, TiN and combinations thereof, metal oxides selected from MgO, Al2O3, Ta2O5, TiO2, ZnO, ZrO2, HfO2, CeO2, Y2O3, La2O3, and combinations thereof, nitrogen oxides, and perovskite phase oxide selected from PZT, BST and combinations thereof.

8. The method of claim 6, wherein, said storage layer comprises a monolayer or multilayer structure having a dielectric material with charge trapping capability, the dielectric material is selected from SiN, HfO, ZrO, and combinations thereof.

9. The method of claim 6, wherein, said barrier layer comprises a monolayer or multilayer structure made of dielectric material selected from silicon oxide, aluminum oxide, hafnium oxide and combinations thereof.

10. The method of claim 5, wherein, said plurality of second material layers are made of doped semiconductor material and are used as a gate conductive layer, the gate conductive layer comprises a monolayer or multilayer structure, said doped semiconductor material comprises polycrystalline silicon, polycrystalline silicon germanium, amorphous silicon, amorphous silicon germanium, microcrystalline silicon, polycrystalline germanium, amorphous germanium and combinations thereof, said conductive material comprises a metal, an alloy of the metal or a nitride of the metal, wherein said metal comprises are selected from Co, Ni, Cu, Al, Pd, Pt, Ru, Re, Mo, Ta, Ti, Hf, Zr, W, Ir, Eu, Nd, Er, La and combinations thereof.

11. The method of claim 10, wherein, a barrier layer of nitride between the gate dielectric layer and the gate conductive layer is further included, the nitride is MxNy, MxSiyNz, MxAlyNz, MaAlxSiyNz, wherein the M is Ta, Ti, Hf, Zr, Mo, W, and combinations thereof, and both if the x and y are greater than or equal to 0 and less than or equal to 1.

12. The method of claim 1, wherein, the device unit comprises a three-dimensional memory based on charge trapping, three-dimensional stack structure of memory cells with polycrystalline or metal floating gate, and a three-dimensional variable resistance memory.

13. The method of claim 1, wherein, said sub-partitions are located on the same side or the different sides of the device unit.

14. The method of claim 1, wherein, the number of said sub-partitions N is a positive integer greater than or equal to 2.

15. The method of claim 1, wherein, said contact leads are distributed in the same plane, or in different planes belonging to different sub-partitions.

16. The method of claim 1, wherein, said step b further comprises, forming a photoresist on the substrate, followed by sequentially exposing each one of said sub-partitions with a total number of N, using the photoresist as a mask, etching said stack structures, sequentially exposing the i*M/N-th layer second material layer in i-th sub-partition, wherein M is the total number of the second material layers.

17. The method of claim 1, wherein, said a plurality of the first material layers are used as insulating spacer layer between gate electrodes.

* * * * *